United States Patent
Bessho

(10) Patent No.: US 6,295,701 B1
(45) Date of Patent: Oct. 2, 2001

(54) SECURING HOOK

(75) Inventor: Akira Bessho, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/379,327

(22) Filed: Aug. 23, 1999

(30) Foreign Application Priority Data

Sep. 2, 1998 (JP) .................................. 10-248614

(51) Int. Cl.⁷ .................................................. H01R 13/73
(52) U.S. Cl. .................................................. 24/297; 24/458
(58) Field of Search ............................... 439/567; 24/662, 24/587, 459, 555, 297, 458; 361/704, 707, 712, 718, 719; 165/80.3, 80.2; 257/718, 719, 726, 727; 174/138 D; 403/329

(56) References Cited

U.S. PATENT DOCUMENTS

| | | |
|---|---|---|
| 5,181,854 * | 1/1993 | Masuda . |
| 5,281,045 * | 1/1994 | Ichikawa . |
| 5,334,048 * | 8/1994 | Bowers et al. . |
| 5,373,104 | 12/1994 | Brauer ................................. 174/52.1 |
| 5,380,067 * | 1/1995 | Turvill et al. . |
| 5,613,877 * | 3/1997 | Patel et al. . |
| 5,678,953 * | 10/1997 | Usui et al. . |
| 6,123,580 * | 9/2000 | Bendorf et al. . |

FOREIGN PATENT DOCUMENTS

| | | | |
|---|---|---|---|
| 1 766 815 | 9/1970 | (DE) . | |
| 72 26 559 | 12/1975 | (DE) | ................................. H05K/7/14 |
| 0 744 886 | 11/1996 | (EP) | ................................. H05K/7/14 |

\* cited by examiner

*Primary Examiner*—James R. Brittain
(74) *Attorney, Agent, or Firm*—Sughrue, Mion, Zinn, Macpeak & Seas, PLLC

(57) ABSTRACT

The inclination of the sliding contact surface of the securing hook that can be slidingly contacted with part of a member to be secured is so set as to become steeper gradually in the mounting direction of the member to be secured, thereby being able to prevent an increase in the pressure angle of the sliding contact surface.

1 Claim, 5 Drawing Sheets

SECURING HOOK

BACKGROUND OF THE INVENTION

1. Field of the Invention

The present invention relates to a securing hook for mounting and fixing a member to be secured such as a printed circuit board, a case cover part, or the like, which is equipped in an electric appliance, at a given position within the main body of the electric appliance.

2. Description of the Related Prior Art

In an electric appliance, it is necessary that a printed circuit board with an integrated circuit and electric elements mounted thereon is mounted and fixed at a given position within the main body of the electric appliance. As a fixing structure used to mount such printed circuit board, for example, there are available a fixing structure of a type that there are opened up in a printed circuit board through holes through which screws for fixing the printed circuit board can be inserted, and the printed circuit board is screwed onto bosses provided in the main body of the electric appliance by inserting such screws through the through holes; and, a fixing structure which uses special metal members developed specially for fixing such printed circuit board. Also, there is widely used a method for fixing a printed circuit board using a securing hook molded of resin, because this method allows the printed circuit board to be fixed easily and is advantageous in the cost of parts required.

Here, FIGS. 4A–4B, 5A–5C and 6 respectively show a conventional securing hook which is formed of resin material. In particular, FIG. 4A is a perspective view of a securing block 300 which is formed of resin material according to an outsert molding method or the like for use in a metal chassis (not shown) or the like. And, FIG. 4B is a perspective view of the securing block 300 and a member to be secured 400 such as a printed circuit board or the like, showing a state thereof in which the member to be secured 400 is mounted on and fixed to the securing block 300.

Also, FIGS. 5A to 5C respectively show a process for mounting and fixing the member to be secured 400 onto the securing block 300, using a section view taken along the line A—A shown in FIG. 4A. Further, FIG. 6 shows a state in which a force to remove the member to be secured 400 from the securing block 300 is applied to the member to be secured 400 fixed to the securing block 300.

Now, description will be given below in detail of the structure of the conventional securing hook with reference to FIGS. 4A, 4B, 5A–5C and 6.

The securing block 300 comprises a receive part 320 on which the member to be secured 400 is to be placed, and a securing hook body 310 which is used to fix the member to be secured 400 onto the receive part 320, while the receive part 320 and securing hook body 310 are formed of resin material as an integrally united body. By the way, the illustrated receive part 320 is formed in a plane shape. And, conventionally, there is also known a method in which, on the plane of the receive part 320, a positioning projection is formed of the same resin material as the receive part 320; and, in the member to be secured 400, there is formed a hole which can be engaged with the positioning projection, whereby the member to be secured 400 can be positioned when mounting and fixing the member to be secured 400.

The securing hook body 310 is composed of a straight portion 311 which extends upwardly in a substantially straight manner, and a hook portion 312 which is disposed in the leading end portion of the straight portion 311. And, in the hook portion 312, there are formed a linear-shaped sliding contact surface 313 which is located on the side of the hook portion 312 where the member to be secured can be secured and also which is inclined downward at a given angle in a direction to move away from the straight portion 311 and, a securing portion 314 which can be engaged with the upper surface of the member to be secured 400 placed on the receive part 320 to thereby fix the member to be secured 400 onto the receive part 320. The securing portion 314 is so formed as to have a surface substantially parallel to the upper surface of the receive part 320 (that is, a surface intersecting substantially at right angles to the extending direction of the straight portion 311).

Now, description will be given below in detail of a process in which the member to be secured 400 such as a printed circuit board or the like is pushed into the above-structured securing block 300 by an assembler and is then fixed onto the receive part 320, with reference to FIGS. 5A to 5C.

Specifically, FIG. 5A shows a state in which, in order to fix the member to be secured 400 onto the securing block 300, the assembler has brought part of one of the sides of the member to be secured 400 into contact with a given position (P1) of the sliding surface 313 of the hook portion 312. In this state, when the assembler tries to push down the member to be secured 400 toward the receive part 320, the member to be secured 400 is pushed at a pressure angle ($\alpha$1) that can be determined by the angle of inclination of the sliding contact surface 313 with respect to a direction in which the member to be secured 400 is pushed.

And, when the assembler, while keeping part of one side of the member to be secured 400 in sliding contact with the sliding contact surface 313, pushes down the member to be secured 400 in the direction of the receive part 320 to thereby move the member to be secured 400 down to a second position (P2) which, as shown in FIG. 5($b$), is present on the sliding contact surface 313 and is located downwardly of the given position (P1), due to the action of the pushing force, the straight portion 311 of the securing hook body 310 is flexed in a direction where it moves apart from the receive part 320 (in FIG. 5B, in the right direction). In this operation, as the straight portion 311 is flexed, there is generated a flexure angle to thereby change the inclination angle of the sliding contact surface 313 with respect to the pushing direction of the member to be secured 400. Accordingly, as shown in FIG. 5B, a pressure angle ($\alpha$2) at the position (P2) becomes greater than the pressure angle ($\alpha$1) at the position (P1).

Now, description will be given below in detail of the variations in the pressure angle with reference to FIG. 7.

That is, in FIG. 7, in a state where a member A having a length of 1 and having the same cross section is held in a cantilever manner with one end a1 thereof fixed, assuming that the free end a2 of the member A is moved by a distance of $\delta$ by applying a force p to the free end a2, the relation shown in the following equation holds (E: modulus of longitudinal elasticity, I: Section secondary moment).

$$\delta = p1^3/3EI$$

$$\theta = P1^2/2EI$$

From the above relation equation, the variation amount of the flexure angle $\theta$ of the member A can be expressed by the following equation:

$$\theta = (3/2l)\delta.$$

Therefore, when taking the above relation into consideration, as shown in FIGS. 5A and 5B, according as the sliding contact position between the member to be secured 400 and sliding contact surface 313 varies as a result of the member to be secured 400 being pushed and moved, the straight portion 311 increases in the flexure amount δ gradually. With the increase in the flexure amount δ, the flexure angle also increases. And, as the flexure angle increases, the pressure angle also increases. Let us express the variations of the sliding contact position between the two elements in a numerical manner. That is, if the initial pressure angle at the position (P1) is expressed as (α1), then the pressure angle (α2) at the position (P2), namely, the flexure amount δ can be expressed as follows:

$$(\alpha 2)=(\alpha 1)+(3/2l)\delta$$

When the assembler has pushed the member to be secured 400 down to a position where the member to be secured 400 can be put on the receive part 320 through the above-mentioned pushing process, due to the restitutive force of the straight portion 311 of the securing hook body 310, the flexure of the straight portion 311 is removed, so that the hook portion 312 is allowed to move toward its original position. At the then time, the securing portion 314 of the securing hook body 310 is engaged with the upper surface of the member to be secured 400 put on the receive part 320. This restricts the movement of the member to be secured 400 in the upward direction thereof, which makes it possible to secure and fix the member to be secured 400 onto the receive part 320.

On the other hand, as shown in FIG. 6, when a force to move the member to be secured 400 away from the securing block 300 is applied to the member to be secured 400 which is secured and fixed to the securing block 300, the straight portion 311 of the securing hook body 310 is flexed in a direction to move away from the receive part 320, with the result that the hook portion 312 is spread out.

In other words, when a force to move the member to be secured 400 away from the securing block 300 is applied to the member to be secured 400 which is secured and fixed to the securing block 300, the hook portion 312 is spread out, which, unfavorably, allows the member to be secured 400 to be removed easily.

In other words, in the above-described conventional securing hook 310, in addition to the above-mentioned problem, as the assembler pushes the member to be secured 400 in the downward direction, that is, in the direction of the receive part 320, the pressure angle thereof increases gradually; and, as the pressure angle thereof increases gradually, it is necessary for the assembler to increase gradually the pushing force to push the member to be secured 400. This requires the assembler to have skill for pushing the member to be secured 400 when assembling the securing hook 310.

SUMMARY OF THE INVENTION

The present invention aims at eliminating the drawbacks found in the above-mentioned conventional securing hook. Accordingly, it is an object of the invention to provide a securing hook which is able to solve such drawbacks or problems.

In attaining the above object, according to a first aspect of the invention, there is provided a securing hook for securing a member to be secured at a given position, comprising: a securing portion (114) to which the member to be secured (200) can be secured; a sliding contact surface (113) with which, when mounting the member to be secured, part of the member to be secured can be slidingly contacted; and, a flexing portion (111) which, when mounting the member to be secured, can be flexed itself, wherein the sliding contact surface is formed such that the inclination angle thereof becomes steeper gradually in the mounting direction of the member to be secured.

Also, according to a second aspect of the invention, in a securing hook as set forth in the first aspect of the invention the inclination angle of the sliding contact surface becomes steeper gradually according to an increase in a flexure angle which varies depending upon the amount of flexure of the flexing portion.

In a securing hook as set forth in the first aspect of the invention, when mounting the member to be secured, the pressure angle is prevented from increasing to thereby be able to facilitate an assembling operation which is to be carried out by an assembler.

Also, in a securing hook as set forth in the first aspect of the invention, when mounting the member to be secured, the pressure angle can be kept substantially constant to thereby be able to further facilitate the assembling operation by the assembler.

DETAILED DESCRIPTION OF THE PREFERRED EMBODIMENTS

Now, description will be given below of a preferred embodiment of a securing hook according to the invention with reference to FIGS. 1A, 1B and 2.

Figure 1A:
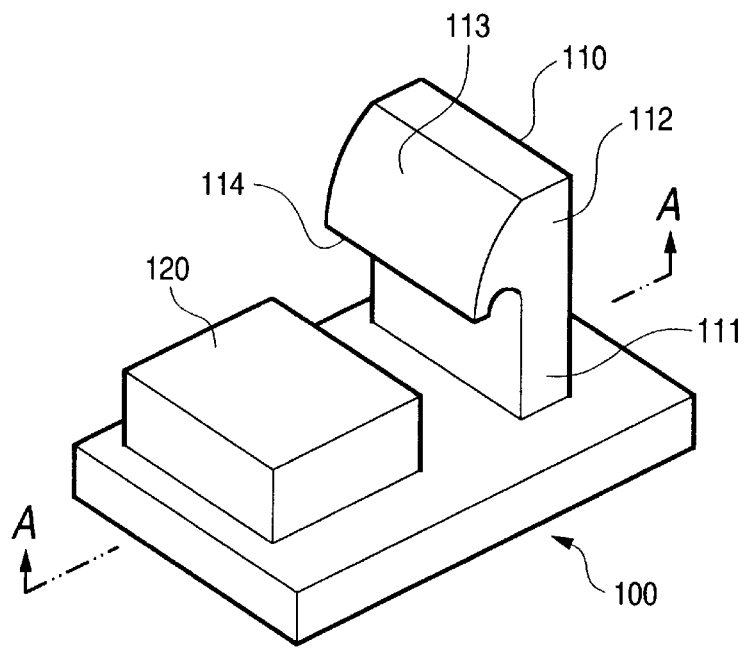
FIGS. 1A and 1B are perspective views of a first embodiment of a securing hook according to the invention.
Figure 1B:
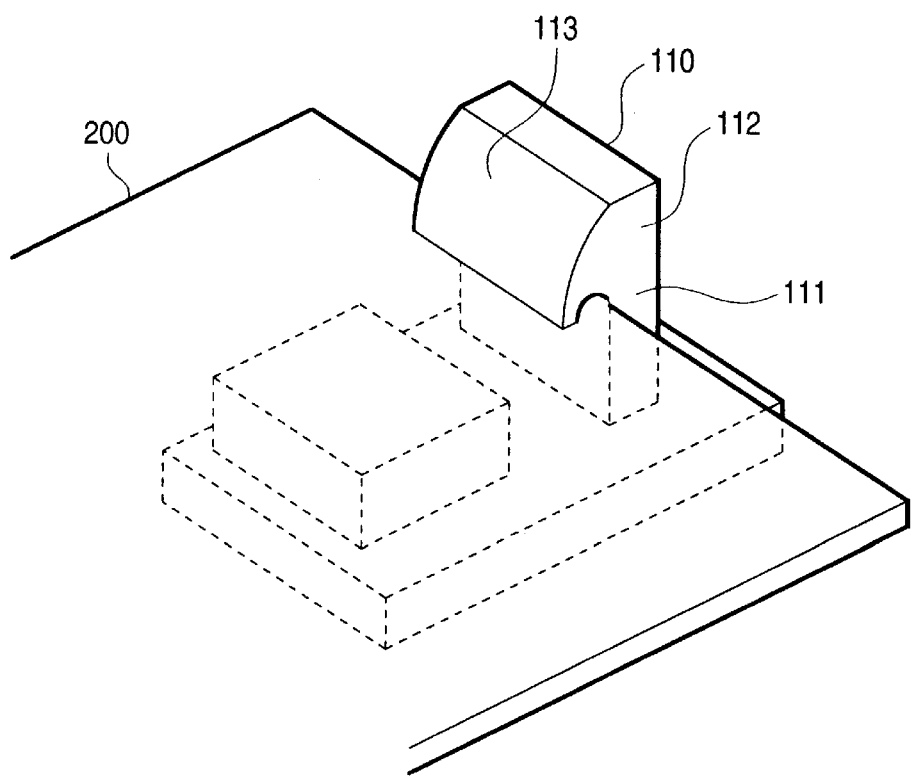

FIG. 1A is a perspective view of a securing block 100 which is formed of resin material, for example, by outsert molding, for use in a metal chassis or the like. Also, FIG. 1B is a perspective view of the securing block 100 and a member to be secured 200 such as a printed circuit board or the like, showing a state thereof in which the member to be secured 200 is fixed to the securing block 100.

The securing block 100 comprises a receive part 120 on which the member to be secured 200 such as a printed circuit board or the like is to be placed, and a securing hook body 110 for fixing the member to be secured 200 onto the receive part 120, while the receive part 120 and securing hook body 110 are formed of resin material as an integrally united body. By the way, the shown receive part 120 is so formed as to have a plane shape, but this is not limitative. For example, on the plane of the receive part 120, a positioning projection may be formed of the same resin material of the receive part 120, and, when the member to be secured 200 is mounted and fixed onto the receive part 120, the thus formed positioning projection may be used to position the member to be secured 200.

The securing hook body 110 comprises a straight portion 111 which extends upwardly substantially in a linear manner, and a hook portion 112 which is formed in the leading end portion of the securing hook body 110. And, in the hook portion 112, there are formed a substantially curved-line shaped, sliding contact surface 113 which is formed on the side of the hook portion 112 where the member to be secured 200 is to be secured and also which is inclined at a given angle toward the bottom of the hook portion 112 in a direction to move away from the straight portion 111; and, a securing portion 114 which can be engaged with the upper surface of the member to be secured 200 put on the receive part 120 to thereby fix the member to be secured 200 onto the receive part 120. Also, the securing portion 114 is previously inclined at a given angle with respect to the upper surface of the receive part 120.

Figure 5A:
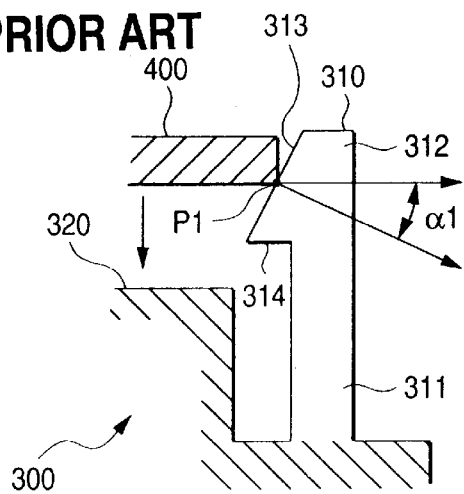
FIGS. 5A to 5C are perspective views of a process for mounting and fixing a member to be secured onto the conventional securing hook.
Figure 5B:
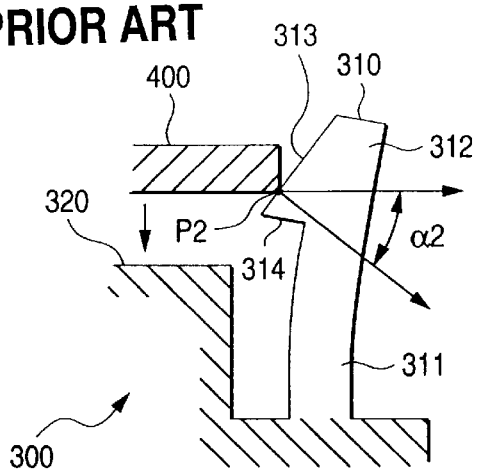
Figure 5C:
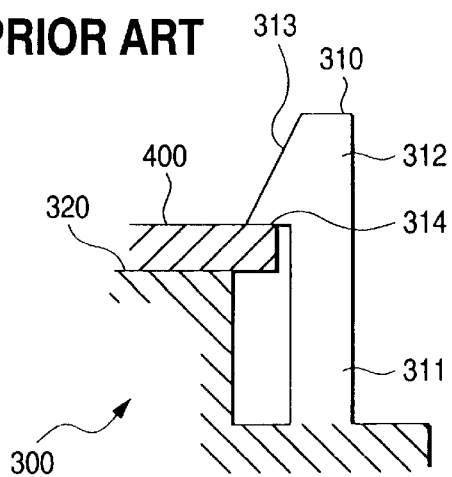
Figure 6:
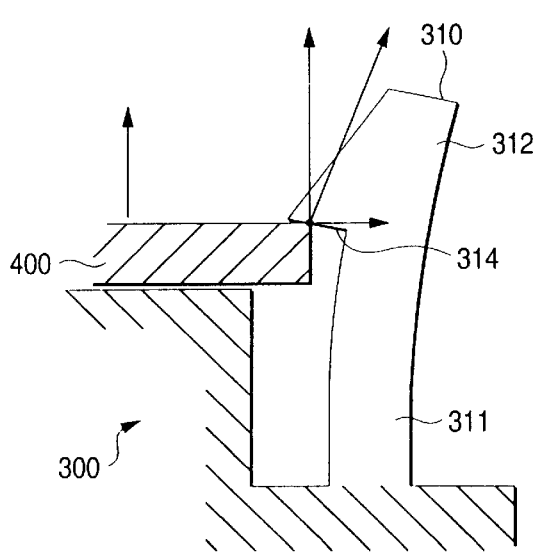
FIG. 6 is a perspective view of the conventional securing hook and member to be secured, showing a state thereof the latter is fixed to the former.
Figure 7:
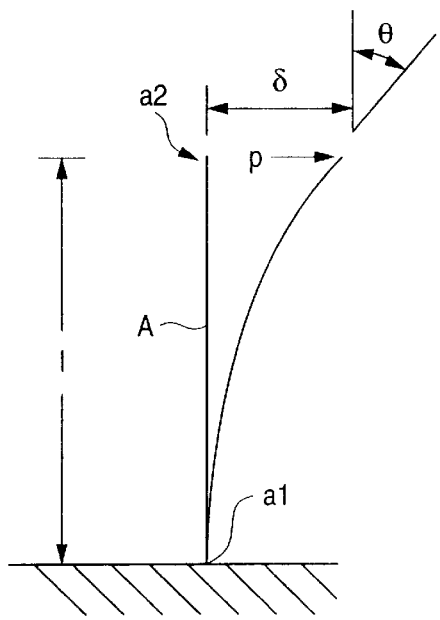
FIG. 7 is a view of the relation between the flexure of a member and the flexure angle thereof.

And, substantially similarly to the conventional securing block 300 shown in FIGS. 5A to 5C, while part of one side of the member to be secured 200 is in sliding contact with the sliding contact surface 113, the member to be secured 200 is mounted and fixed onto the receive part 120 through a process for pushing the same in the downward direction which is the direction of the receive part 120.

However, obviously from the above description, in the securing hook shown in the present embodiment of the invention, when compared with the conventional securing hook 310, the sliding contact surface 113 and securing portion 114 are improved. Next, description will be given below in detail of the contents of the improvements in the present securing hook.

Figure 2:
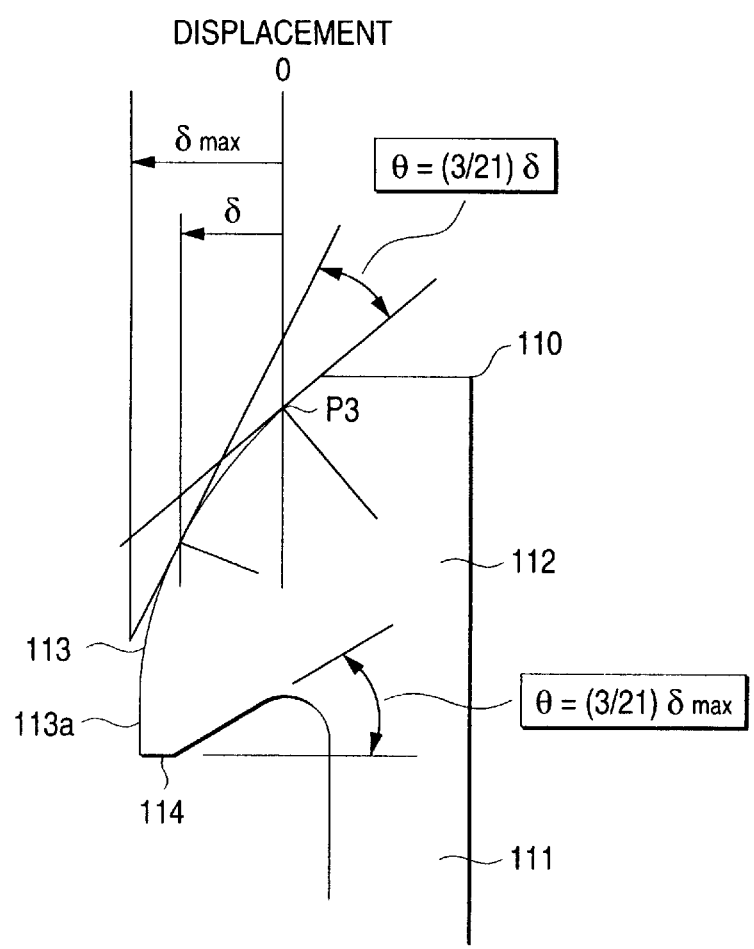
FIG. 2 is a view of a hook portion employed in the securing hook according to the first embodiment of the invention.

In FIG. 2, there is shown an enlarged view of the hook portion 112, in particular, a section view taken along the line A—A shown in FIG. 1A. As shown in FIG. 2, the sliding contact surface 113 is formed as a substantially curved-line shaped, inclined surface. The inclination of the sliding contact surface 113 is arranged in the following manner: that is, if a point where the member to be secured 200 is firstly contacted with the sliding contact surface 113 when the member to be secured 200 is pushed into the securing block 100 is expressed as P3 (which corresponds to P1 in FIG. 5A), then the inclination becomes gradually steeper by $(3/2I)\delta$ according to the shifted position $\delta$ of the contact point with respect to the position P3, while the leading end face 113$a$ of the sliding contact surface 113 is set as a vertical surface.

That is, due to the fact that the inclination of the sliding contact surface 113 becomes gradually steeper according to an increase in a flexure angle which is produced as the straight portion 111 is flexed, even when the straight portion 111 is flexed, the pressure angle is free from the influence of the flexure angle. Also, since the leading end face 113$a$ is set as a vertical surface, the pressure angle is equal to the flexure angle in this area, namely, in the area of the leading end face 113$a$.

Therefore, in the process for pushing the member to be secured 200 into the securing block 100, even if the straight portion 111 serving as a flexing portion is flexed, the pressure angle can be always kept constant and also the pressure angle in the leading end face 113$a$ area can be controlled to such a level that it is equal to the flexure angle. As a result of this, the assembler is able to mount and fix the member to be secured 200 onto the securing block 100 easily without applying a large force to the member to be secured 200.

Also, the securing portion 114 is previously inclined at an angle of $(3/2I)\delta$ with respect to the upper surface of the receive part 120, that is, with respect to the upper surface of the member to be secured 200. Therefore, when a force to move the member to be secured 200 fixed to the securing block 100 from the securing block 100 is applied to the member to be secured 200, even if the straight portion 111 is flexed, since the securing portion 114 is inclined, the hook portion 112 is prevented from spreading out (that is, the securing portion 114 is in contact with the upper surface of the member to be secured 200 through its surface substantially parallel to the upper surface of the member to be secured 200), which in turn prevents the member to be secured 200 against easy removal.

Figure 8:
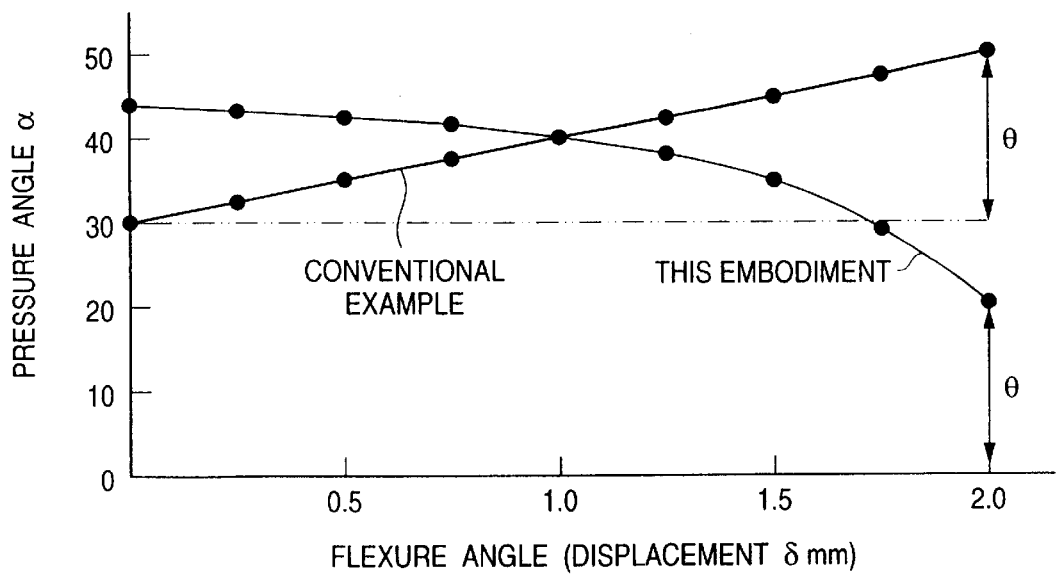
FIG. 8 is a view of variations obtained not only in the pressure angles of the securing hook according to the invention but also in the pressure angles of the conventional securing hook.

The above-mentioned sliding contact surface 113 is structured such that the pressure angle thereof when the member to be secured 200 is mounted and fixed can be kept substantially constant. However, this is not limitative but, for example, for the purpose of facilitation of the assembling operation, as shown in FIG. 8, the pressure angle of the sliding contact surface 113 may decrease gradually according to the flexure amount of the straight portion 111 and, by forming the leading end thereof as a vertical surface, the pressure angle can be finally equal to the flexure angle. By the way, in FIG. 8, in addition to variations in the pressure angle obtained in the securing hook according to the invention, there are also shown variations in the pressure angle obtained in the conventional securing hook.

Figure 3:
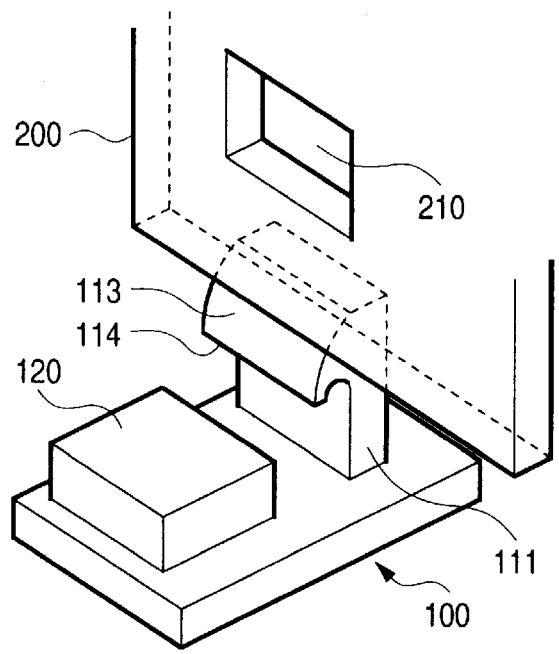
FIG. 3 is a perspective view of a second embodiment of a securing hook according to the invention.
Figure 4A:
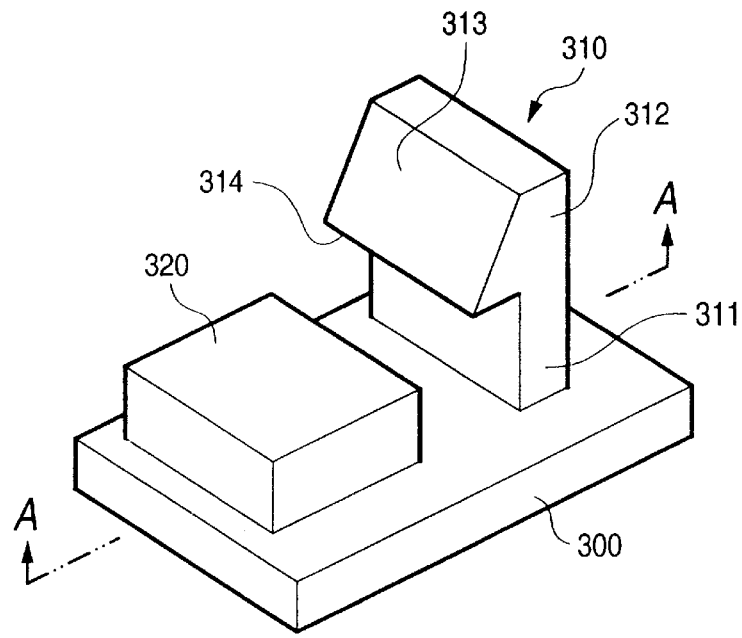
FIGS. 4A and 4B are perspective views of a conventional securing hook.
Figure 4B:
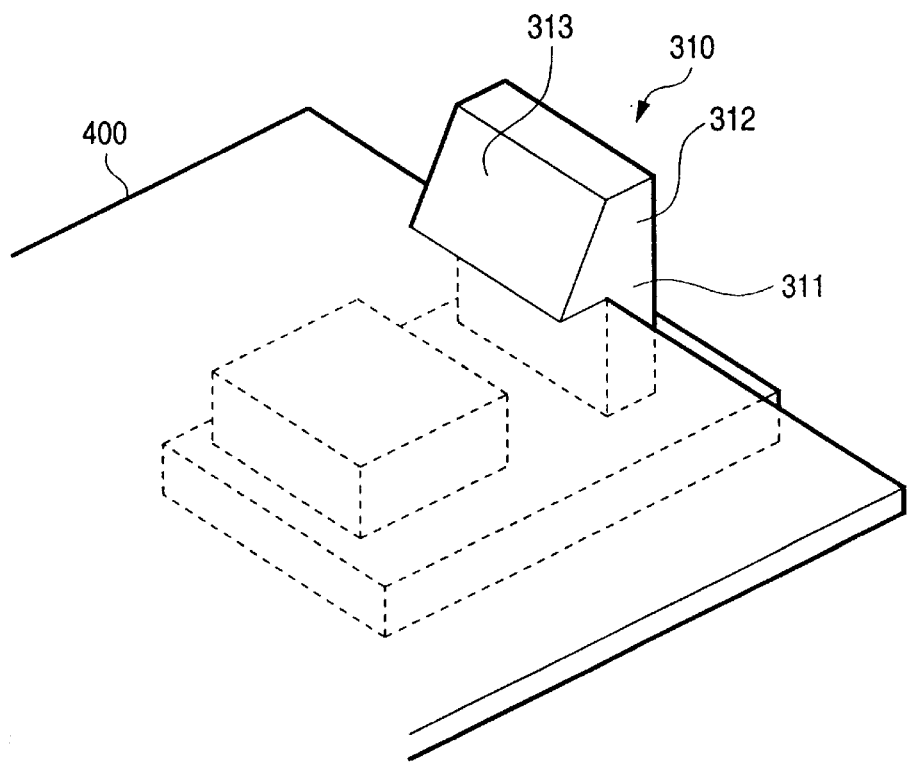

Also, as shown in FIG. 3, there may be employed a fixing structure in which the hook portion 112 can be engaged with a hole formed in the member to be secured 200 and, this fixing structure may be used to fix not only the printed circuit board but also the cover body.

As has been described in detail heretofore, according to the invention, when mounting the member to be secured, the pressure angle of the sliding contact surface is prevented from increasing, thereby being able to facilitate the assembling operation to be executed by the assembler.

Also, when mounting the member to be secured, the pressure angle of the sliding contact surface can be kept substantially constant, thereby being able to further facilitate the assembling operation to be executed by the assembler.

What is claimed is:

1. A securing hook for securing a member at a given position, said securing hook comprising:

a flexing portion; and a hook portion provided on said flexing portion, said hook portion having
   (1) a securing portion that abuts against said member in a non-deformed state when said member is secured at the given position, and
   (2) a sliding contact surface having an inclination angle that increases in a mounting direction of said member;

wherein, when mounting said member, said member slides across said sliding contact surface and deforms said flexing portion, wherein the inclination angle of said sliding contact surface increases from a first point to a second point of said sliding contact surface by a flexure angle $\alpha$ according to the formula $\alpha=(3/2I)\delta$, where I is a section secondary moment, and $\delta$ is a flexure amount of said flexing portion that occurs when said member slides across said sliding contact surface from said first point to said second point.

* * * * *